United States Patent
Abe et al.

(10) Patent No.: US 8,698,499 B2
(45) Date of Patent: Apr. 15, 2014

(54) ELECTROMAGNET DEVICES COMPATIBLE WITH MAGNETIC RESONANCE AND MRI DEVICES WHERE CIRCULATING CURRENT DIRECTIONS ALTERNATE BETWEEN COIL GROUPS SEPARATED BY ELEVATION ANGLES BETWEEN 26.25 AND 55 DEGREES

(75) Inventors: Mitsushi Abe, Hitachinaka (JP);
Hiroyuki Watanabe, Hitachi (JP);
Hirotaka Takeshima, Ryugasaki (JP)

(73) Assignees: Hitachi, Ltd., Tokyo (JP); Hitachi Medical Corporation, Tokyo (JP)

( * ) Notice: Subject to any disclaimer, the term of this patent is extended or adjusted under 35 U.S.C. 154(b) by 1101 days.

(21) Appl. No.: 12/516,077

(22) PCT Filed: Sep. 19, 2007

(86) PCT No.: PCT/JP2007/068154
§ 371 (c)(1),
(2), (4) Date: Jan. 6, 2010

(87) PCT Pub. No.: WO2008/062599
PCT Pub. Date: May 29, 2008

(65) Prior Publication Data
US 2011/0037469 A1    Feb. 17, 2011

(30) Foreign Application Priority Data
Nov. 22, 2006  (JP) ................ 2006-315907

(51) Int. Cl.
*G01R 33/381* (2006.01)
*G01R 33/3815* (2006.01)

(52) U.S. Cl.
USPC .................. 324/319; 324/320; 324/318

(58) Field of Classification Search
USPC ............ 324/300–322; 600/407–435; 382/128–131
See application file for complete search history.

(56) References Cited

U.S. PATENT DOCUMENTS

| | | | | |
|---|---|---|---|---|
| 5,307,039 | A * | 4/1994 | Chari et al. | 335/299 |
| 5,396,207 | A * | 3/1995 | Dorri et al. | 335/216 |
| 5,416,415 | A * | 5/1995 | Dorri et al. | 324/318 |
| 5,708,362 | A * | 1/1998 | Frese et al. | 324/319 |
| 5,982,260 | A * | 11/1999 | Byrne | 335/216 |

(Continued)

FOREIGN PATENT DOCUMENTS

| | | |
|---|---|---|
| JP | 09-238917 | 9/1997 |
| JP | 2000-279394 | 10/2000 |

(Continued)

*Primary Examiner* — Melissa Koval
*Assistant Examiner* — Tiffany Fetzner
(74) *Attorney, Agent, or Firm* — Antonelli, Terry, Stout & Kraus, LLP.

(57) ABSTRACT

An electromagnet device which generates magnetic field in the direction perpendicular to the inserting direction of an inspection subject is reduced in size and weight by removing unnecessary arrangement as much as possible. A magnetic resonance imaging device is also provided. The electromagnet device comprises a first coil (31) through which a first circular current (J1) circulates forward, a second coil (32) through which a second circular current (J2) circulates reversely, and a coil group (30) through which a plurality of circular currents (J3-J6) circulate alternately forward and reversely. The first coil (30), the second coil (32) and the coil group (30) are arranged in this order to increase the angle of elevation θ (θ1<θ2<θ3), and a blank region (S) not including the second coil (32) and the coil group (30) exists in the angular region between the angles of elevation θ2 and θ3.

18 Claims, 6 Drawing Sheets

(56) References Cited

U.S. PATENT DOCUMENTS

| | | | |
|---|---|---|---|
| 6,335,670 B1 | 1/2002 | Kinanen | |
| 6,570,475 B1 * | 5/2003 | Lvovsky et al. | 335/216 |
| 6,600,318 B1 * | 7/2003 | Kakugawa et al. | 324/318 |
| 6,853,281 B1 | 2/2005 | Kakugawa et al. | |
| 6,861,933 B1 | 3/2005 | Yoshida et al. | |
| 7,071,694 B1 | 7/2006 | Kruip | |
| 7,109,708 B2 * | 9/2006 | Havens | 324/307 |
| 7,167,004 B1 * | 1/2007 | Kruip | 324/320 |
| 7,242,191 B2 * | 7/2007 | Laskaris et al. | 324/318 |
| 7,271,590 B2 * | 9/2007 | Ariyoshi | 324/320 |
| 7,274,192 B2 * | 9/2007 | Havens | 324/319 |
| 7,498,810 B2 * | 3/2009 | Lvovsky et al. | 324/318 |
| 7,928,730 B2 * | 4/2011 | Aoki et al. | 324/318 |
| 2004/0100261 A1 * | 5/2004 | Laskaris et al. | 324/318 |
| 2004/0155744 A1 | 8/2004 | Overweg | |
| 2006/0038565 A1 * | 2/2006 | Havens | 324/318 |
| 2006/0055406 A1 * | 3/2006 | Lvovsky et al. | 324/318 |
| 2006/0082369 A1 * | 4/2006 | Ariyoshi | 324/318 |
| 2006/0220646 A1 | 10/2006 | Kurome et al. | |
| 2006/0267585 A1 * | 11/2006 | Havens | 324/318 |
| 2007/0170921 A1 * | 7/2007 | Aoki et al. | 324/319 |
| 2011/0037469 A1 * | 2/2011 | Abe et al. | 324/318 |

FOREIGN PATENT DOCUMENTS

| | | |
|---|---|---|
| JP | 2002-010993 | 1/2002 |
| JP | 2002-336215 | 11/2002 |
| JP | 2005-304597 | 11/2005 |
| WO | WO 99/27851 | 6/1999 |
| WO | WO 02/27345 A1 | 4/2002 |

* cited by examiner

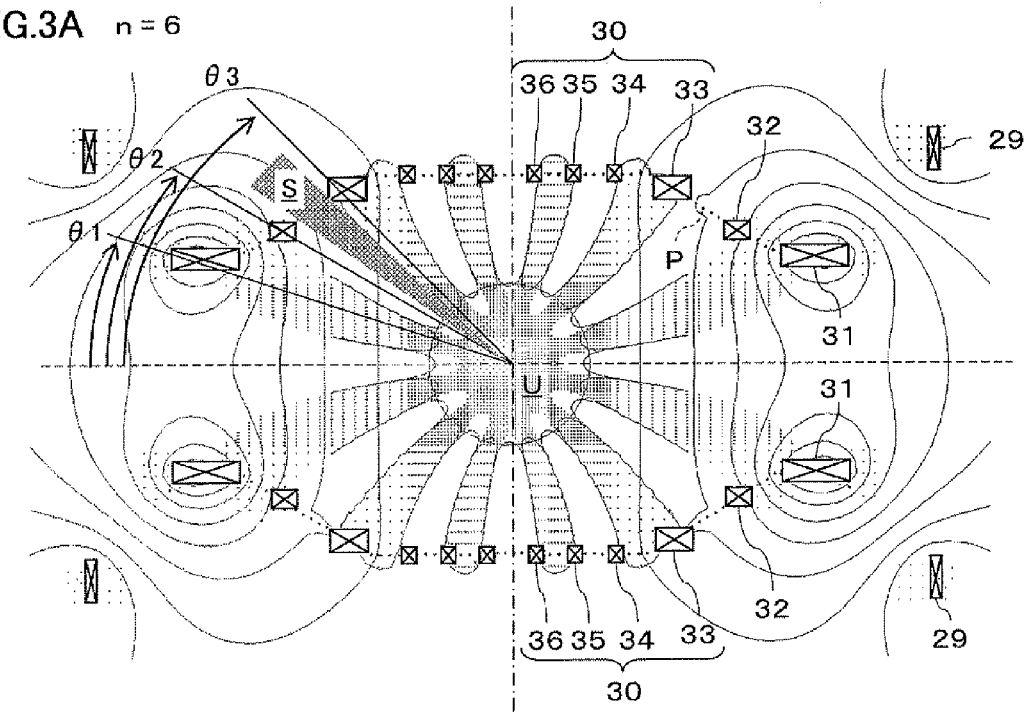
FIG.3A n = 6
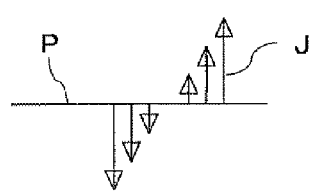
FIG.3B
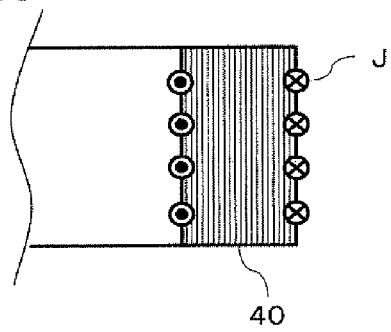
FIG.3C
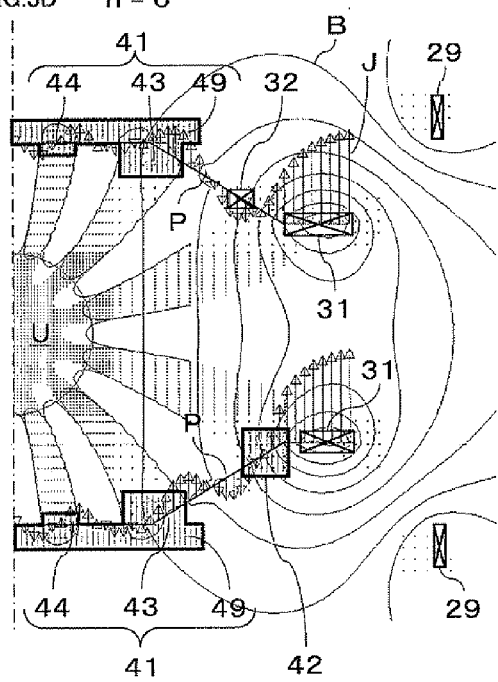
FIG.3D n = 6

ELECTROMAGNET DEVICES COMPATIBLE WITH MAGNETIC RESONANCE AND MRI DEVICES WHERE CIRCULATING CURRENT DIRECTIONS ALTERNATE BETWEEN COIL GROUPS SEPARATED BY ELEVATION ANGLES BETWEEN 26.25 AND 55 DEGREES

CROSS REFERENCE TO RELATED APPLICATIONS

This application claims the foreign priority benefit under Title 35,United States Code, §119(a)-(d) of Japanese Patent Application No. 2006-315907, filed on Nov. 22, 2006,the contents of which are hereby incorporated by reference.

FIELD OF THE INVENTION

The present invention relates to an electromagnet device which generates a static magnetic field to be induced by a current which circulates circularly, and more particularly to an electromagnet device which generates the static magnetic field in a direction perpendicular to an insertion direction of an inspection subject and a magnetic resonance imaging device to which the electromagnet device is applied.

DESCRIPTION OF RELEVANT ART

In a magnetic resonance imaging device (hereinafter, referred to as MRI device: Magnetic Resonance Imaging device), an inspection subject is inserted in a homogeneous magnetic field region, which is formed by an electromagnet device, as an imaging region. In addition, a gradient magnetic field whose magnetic field direction is sequentially changed is superimposed on the imaging region and the inspection subject is irradiated by a high frequency pulse. By utilizing a phenomenon of nuclear magnetic resonance (hereinafter, referred to as NMR phenomenon: Nuclear Magnetic Resonance phenomenon) generated at this time, an image showing physical and chemical characteristics of the inspection subject is taken.

A medical MRI device is divided into two types. One is a horizontal magnetic field type (hereinafter, referred to as horizontal field MRI device) where a homogeneous magnetic field is generated in the horizontal direction. The other is a vertical magnetic field type (hereinafter, referred to as vertical field MRI device) where a homogeneous magnetic field is generated in the vertical direction.

Generally, a latter vertical field MRI device is superior to the former type in that a large space for inserting an inspection subject is secured and a degree of freedom of operations is increased in comparison with the former type.

However, the vertical field MRI device houses, for example, a coil for circulating current circularly and a ferromagnetic material for increasing and homogenizing a homogeneous magnetic field in a chamber, as well as the vertical field MRI device is required to have a mechanical rigidity for facing two chambers weighted with the coil and ferromagnetic material with high accuracy in the vertical direction.

In addition, in a medical MRI device, a homogeneous magnetic field to be formed in the imaging region is required to be high in a wide area for practicing high medical diagnostics (for example, patent document 1).

Patent document 1: Japanese Patent Laid-open Publication No. 2000-279394

DISCLOSURE OF THE INVENTION

Problems to be Solved

With respect to a vertical field MRI device which forms a high and homogeneous magnetic field in a wide area in the imaging region, increases in size and weight of the device are inevitable.

Namely, an enlargement of diameter of circular current for circulating the current circularly is inevitable for forming a homogeneous magnetic field in a wide area. If the diameter of the circular current is enlarged, an increase of the current is required for maintaining the homogeneous magnetic field, resulting in increase in a number of wound wire and increase in weight thereof. Or else, even if a number of ferromagnetic material is increased for maintaining intensity and uniformity of the homogeneous magnetic field, weight of the vertical field MRI device will be increased.

Therefore, a mechanism for supporting main components such as the coil and the ferromagnetic material which are enlarged and increased in weight, while maintaining a dimensional accuracy in the vertical direction, becomes large, and the MRI device further increases in size and weight if a mechanism for shielding a magnetic field which leaks outside is disposed.

The present invention has been developed for solving these issues, and it is, therefore, an object of the present invention to provide an electromagnet device and a magnetic resonance imaging device which are reduced in size and weight by removing unnecessary components for forming a homogeneous magnetic field region which has a predetermined size and magnetic field intensity.

SUMMARY OF THE INVENTION

To solve the problems described above, there is provided an electromagnet device or a magnetic resonance imaging device which is provided with a pair of static magnetic field generation units for generating a static magnetic field in an imaging region, wherein the static magnetic field generation units includes at least: a first coil where a first circular current circulates in a forward direction; a second coil where a second circular current circulates in a backward direction; and a coil group where a plurality of circular currents whose radiuses are different each other circulate in the forward direction and the backward direction alternately in adjacent coils, wherein the first coil, the second coil, and the coil group are arranged so that an elevation angle of each of the first coil, the second coil, and the coil group seen from a center of the imaging region becomes larger in this order, wherein there exists a domain where the second coil and the coil group are not included in an angle domain sandwiched between the elevation angles of the second coil and the coil group.

Or, in the configuration described above, the coil group may be replaced with a first magnetization member to be magnetized by a magnetic field induced by the first circular current.

Or, in the configuration described above, the second coil may be replaced with a second magnetization member to be magnetized by a magnetic field induced by the first circular current.

With the configuration described above, a fluctuation of low and high magnetic flux density which is radially distributed from the center of the imaging region and originating from the domain is formed in a space where the pair of the static magnetic field generation units face each other. Since the fluctuation of low and high magnetic flux density formed as described above becomes small as a position approaches to the center of the radial pattern, the homogeneous magnetic field region is formed in the imaging region, accordingly. According to the configuration forming the homogeneous magnetic field region described above, it is possible to make a diameter, which dominates a size of whole electromagnet device, of the first coil small, and no need to dispose an excess ferromagnetic material.

According to the present invention, there is provided an electromagnet device and a magnetic resonance imaging device which are reduced in size and weight by removing unnecessary components for forming a homogeneous magnetic field region having a predetermined intensity in a predetermined area.

BRIEF DESCRIPTION OF THE DRAWINGS

FIG. 3A is an illustration showing a distribution of magnetic flux around an imaging region in an electromagnet device (order n=6) according to the first embodiment;

FIG. 3B is a schematic diagram virtually showing a case where circular currents circulate on a coil arrangement surface in the electromagnet device (order n=6) according to the first embodiment;

FIG. 3C is an illustration showing an arrangement of a magnetization member which is equivalent to a circular current virtually shown in FIG. 3B in the electromagnet device (order n=6) according to the first embodiment;

FIG. 3D is an illustration showing virtual circular currents circulating on the coil arrangement surface and a replacement of a part of a plurality of coils with a magnetization member in the electromagnet device (order n=6) according to the first embodiment;

EXPLANATION OF SYMBOLS

Figure 1:
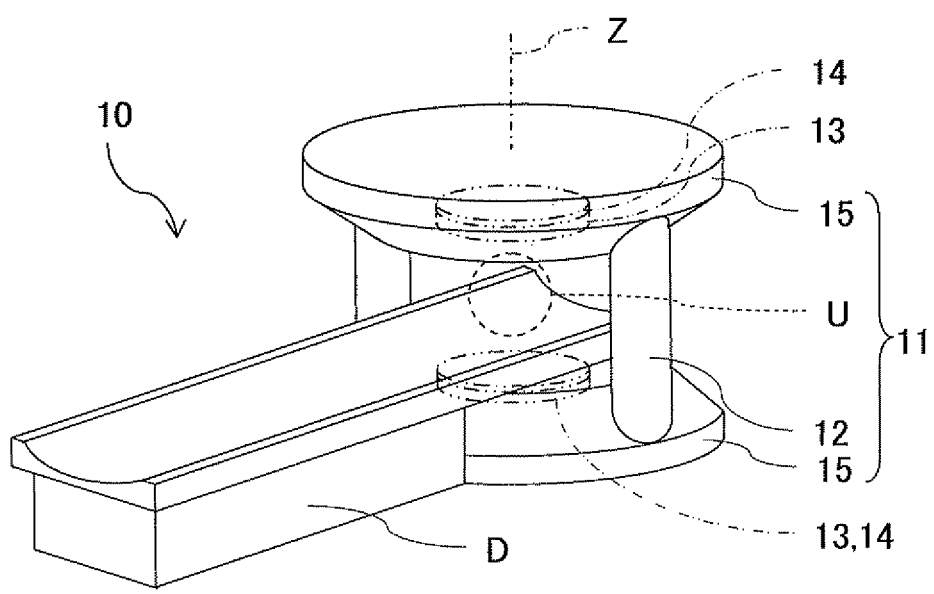
FIG. 1 is a whole perspective view showing an embodiment of magnetic resonance imaging device (MRI device) according to the present invention.

10 MRI device
11 Electromagnet device
13 Gradient magnetic field generation unit
14 Magnetic field adjustment unit
15 Static magnetic field generation unit
20 Vacuum chamber (Chamber)
22 Cylinder side surface
23 Circular cone surface
24 Inner end surface
25 Depressed surface
30 Coil group
31 First coil
32 Second coil
41 First magnetization member
42 Second magnetization member
43 First annular body
44 Second annular body
J1 First circular current (circular current)
J2 Second circular current (circular current)
J3 Third circular current (circular current)
J4 Fourth circular current (circular current)
J5 Fifth circular current (circular current)
J6 Sixth circular current (circular current)
P Arrangement surface
S Empty domain (domain)
U Imaging region (homogeneous magnetic field region)
Z Center axis
n order
$\theta$ ($\theta 1$, $\theta 2$, $\theta 3$) Elevation angle

DETAILED DESCRIPTION OF THE PREFERRED EMBODIMENT (First Embodiment)

Hereinafter, a magnetic resonance imaging device (MRI device) according to a first embodiment of the present invention will be explained by referring to drawings.

As a whole perspective view is shown in FIG. 1, a MRI device 10 is provided with a pair of gradient magnetic field generation units 13, 13 and a pair of magnetic field adjustment units 14, 14 so that the gradient magnetic field generation units 13, 13 and the magnetic field adjustment units 14, 14 surround an imaging region U in an electromagnet device 11, and a bed D for inserting an inspection subject (not shown) therein is disposed in the imaging region U. In addition, the MRI device 10 includes, for example, an RF oscillator unit (RF: Radio Frequency) which radiates an electromagnetic wave having a resonant frequency (more than several MHz) to develop a NMR phenomenon on an inspection subject, a reception coil for receiving a response signal to be emitted when the NMR phenomenon is developed and a spin state of hydrogen nucleus is changed, a control unit for controlling these components, and an analysis unit for processing and analyzing the received signal, as the components not shown.

In the electromagnet device 11, a pair of static magnetic field generation units 15, 15 facing each other, which are rotationally symmetric around a center axis Z, are supported by support members 12 so that the static magnetic field generation units 15, 15 sandwich the imaging region U.

The static magnetic field generation units 15, 15 form a homogeneous magnetic field region in the imaging region U by a static magnetic field induced by a circular current circulating around the center axis Z. The magnetic field in the homogeneous magnetic field region is required a uniformity of about millionth (several ppm) of variation (fluctuation). The homogeneous magnetic field region is a stationary static magnetic field which does not vary with time and generally has strength of 0.1 to not less than several tesla. The homogeneous magnetic field region has a spherical shape or a spheroidal shape having a diameter of 30 to 40 cm.

The gradient magnetic field generation units 13, 13 superimpose a gradient magnetic field on the homogeneous magnetic field so that magnetic field intensity in the imaging region U is graded. The gradient magnetic field to be superimposed is superimposed on three directions orthogonal to each other of the imaging region U by sequentially changing the direction of the superimposition when the MRI device 10 is operated. As described above, since the intensity of the magnetic field in the imaging region U is sequentially graded for the three directions orthogonal to each other, a three-dimensional position where the NMR phenomenon is developed is identified.

In the magnetic field adjustment unit 14, many screw members made of magnetic material are arbitrarily distributed on a plane perpendicular to the center axis Z to increase a uniformity of the magnetic field in the imaging region U. Namely, in the electromagnet device 11, a uniformity error of the magnetic field, which is formed in the imaging region U, is generated due to the effects of assembly error and installation environment. Therefore, the error is corrected (adjusted) by the magnetic field adjustment unit 14.

With the configuration described above, the MRI device 10 develops the NMR phenomenon only in a concerned area (sliced plane, 1 mm thick in general) of the imaging region U, and images the sliced plane of an inspection subject.

Figure 2A:
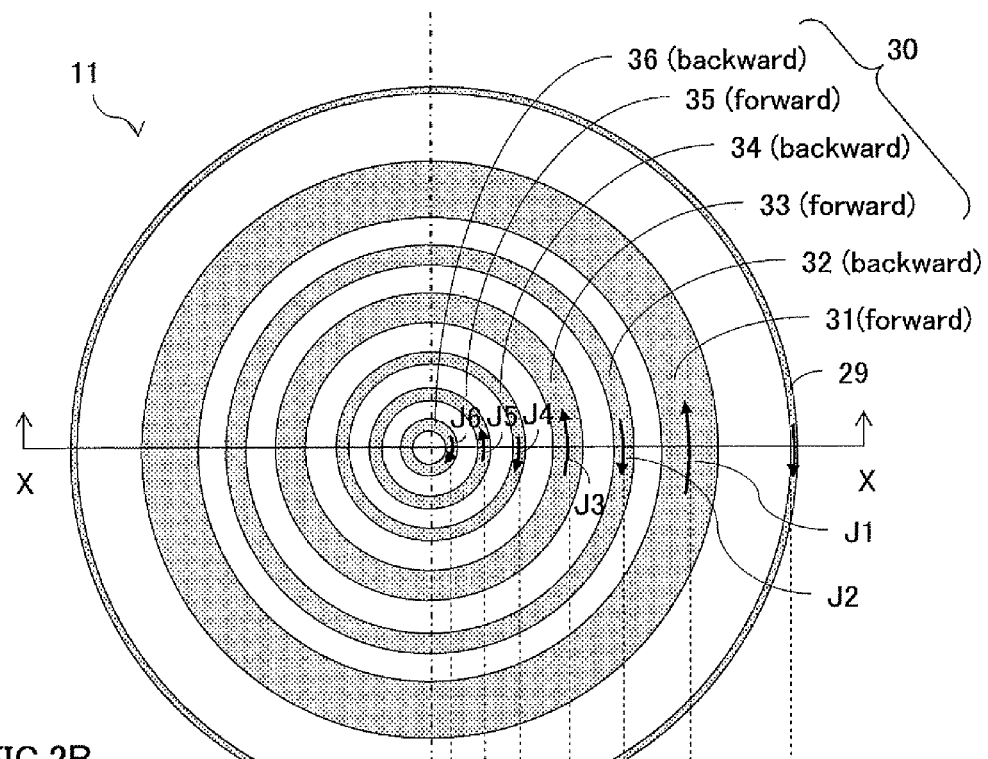
FIG. 2A shows an arrangement of coils on a horizontal plane of an electromagnet device in a first embodiment of electromagnet device according to the present invention.
Figure 2B:
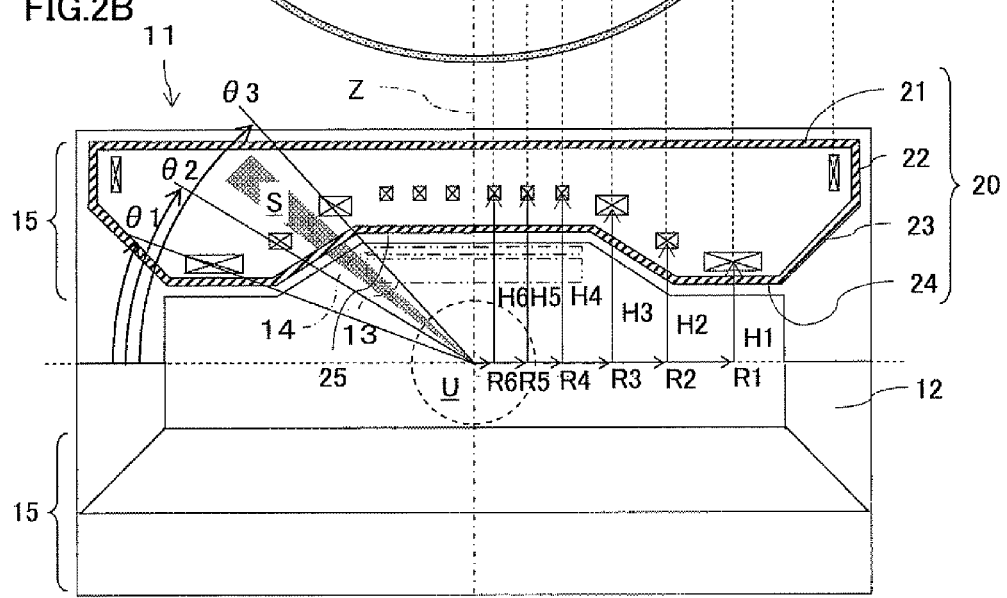
FIG. 2B shows a vertical section of the electromagnet device taken along X-X line of FIG. 2A in the first embodiment of electromagnet device according to the present invention.

The static magnetic field generation unit 15 is provided with a chamber 20 where a plurality of coils (symbol: 29-36) are fixed and housed therein as shown in FIG. 2A and FIG. 2B. Here, FIG. 2A shows an arrangement of coils (symbol: 29-36) on a horizontal plane of the electromagnet device 11. FIG. 2B shows a vertical section of the electromagnet device 11 taken along X-X line of the electromagnet device 11.

The chamber 20 consists of an outer end surface 21, a cylinder side surface 22, a circular cone surface 23, an inner end surface, and a depressed surface 25.

The chamber 20 is made of non-magnetic and high elastic material such as stainless steel and connected to one end of the support member 12 as a base which supports the static magnetic field generation units 15, 15 disposed in the vertical direction. In addition, the plurality of coils (symbol: 29-36) described above are rigidly fixed inside the chamber 20 by fixing means not shown so that positions of the coils are never displaced when an electromagnetic force works thereon.

In addition, if at least one of the plurality of coils (symbol: 29-36) is a superconducting coil, the chamber 20 further includes a coolant vessel (not shown) for housing the superconducting coil as well as a coolant thereof.

In this case, the chamber 20 is a vacuum chamber which maintains a vacuum condition inside the sealed space and prevents heat from being transferred to the coil and coolant by conduction and convection.

Here, a superconducting coil is such a coil that if it is cooled down below a critical temperature by a coolant (for example, liquid helium), electric conduction of the superconducting coil changes from a normal conducting state to a superconducting state, and the electric resistance becomes zero, resulting in maintaining a permanent circular current without attenuation of the circular current.

The depressed surface 25 is disposed approximately perpendicular to the center axis Z so that the depressed surface 25 is depressed to make a step from an extending surface of the inner end surface 24 in a portion facing the imaging region R.

The depressed surface 25 formed as described above does not interfere in structure with a plurality of coils (symbol: 30-32) which are arranged in a dome-like shape, as described later. In addition, since the gradient magnetic field generation unit 13 and the magnetic field adjustment unit 14 can be disposed in a space formed by the depressed surface 25, a large space (space between static magnetic field generation units 15, 15) for inserting an inspection subject can be secured. Namely, the depressed surface 25 contributes to reduce a size of the electromagnet device 11 in contrast with a size of the imaging region U.

The circular cone surface 23 is formed in a portion between the cylinder side surface 22 and the inner end surface 24 of the chamber 20. With the configuration described above, a weight of the electromagnet device 11 can be largely reduced in comparison with the case where a periphery end portion of the chamber 20 is formed with only the cylinder side surface 22 and the inner end surface 24 without disposing the circular cone surface 23, thereby resulting in reducing the weight of the electromagnet device 11.

As shown in FIG. 2B, the first coil 31 has a circular shape with a radius R1 and is arranged at a position of height H1 from the center of the imaging region U in the center axis Z direction. In the first coil 31, a first circular current J1 circulates around the center axis Z in the forward direction. The first circular current J1 circulating in the forward direction forms a magnetic field having a direction identical to that of the homogeneous magnetic field in the imaging region U and contributes to form the homogeneous magnetic field.

It is noted that, in the drawing, arrows indicating the forward direction of the circular current mean a counterclockwise direction and arrows indicating the backward direction mean a clockwise direction. However, the directions of the circular currents are not limited as described above.

A second coil 32 has a circular shape with a radius R2 (<R1) and is arranged at a position of height H2 (>H1) from the center of the imaging region U in the center axis Z direction. In the second coil 32, a second circular current J2 circulates around the center axis Z in the backward direction. The second circular current J2 circulating in the backward direction forms is a magnetic field having a direction opposite to that of the homogeneous magnetic field in the imaging region U and contributes to form the homogeneous magnetic field.

A coil group 30 consists of a third coil 33, a fourth coil 34, a fifth coil 35, and a sixth coil 36, which are arranged concentrically around the common center axis Z.

The third coil 33 is located at the outermost position in the coil group 30, has a circular shape with a radius R3 (<R2), and arranged at a position of height H3 (>H2) from the center of the imaging region U in the center axis Z direction. In the third coil 33, a third circular current J3 circulates around the center axis Z in the forward direction. The third circular current J3 circulating in the forward direction forms a magnetic field having a direction identical to that of the homogeneous magnetic field in the imaging region U and contributes to form the homogeneous magnetic field.

The fourth coil 34, the fifth coil 35, and the sixth coil 36 have a circular shape with respective radiuses (R4>R5>R6) which become smaller in this order, and are arranged at positions of respective heights H4, H5, and H6 (≥H3) from the center of the imaging region U in the center axis Z direction. In the fourth coil 34, fifth coil 35, and sixth coil 36, circular currents J4, J5, and J6 circulate around the center axis Z, respectively, so as to alternate a direction of the current in the adjacent coils in the forward direction and the backward direction. Each of the circular currents J4, J5, and J6 which circulates alternately in the forward direction and the backward direction in the adjacent coils forms a magnetic field having a direction identical to or opposite to that of the homogeneous magnetic field and contributes to form the homogeneous magnetic field.

The first coil 31, the second coil 32, and the coil group 30 described above are arranged so that an elevation angle θm (m=1 to 6, see formula (1)) of each of the coils (symbol: 31-36), which form the homogeneous magnetic field, seen from the center of the imaging region U becomes larger as the radius R becomes smaller (θ1<θ2<θ3).

In the arrangements of the coils (symbol: 31-36) which form the homogeneous magnetic field, if the arrangements are seen from the center of the imaging region U, all members forming the homogeneous magnetic field in the imaging region U are arranged on a dome-like surface.

$$\theta m = \tan^{-1}(Hm/Rm) \quad (1)$$

$$R6 < R5 < R4 < R3 < R2 < R1 \quad (2)$$

$$H6 \geq H5 \geq H4 \geq H3 \geq H2 \geq H1 \quad (3)$$

In addition, a positional relation between the second coil 32 and the coil group 30 is set so that there exists a domain (hereinafter, referred to as empty domain S), where the second coil 32 and the coil group 30 are not included, in an angle domain sandwiched between the elevation angles of the second coil 32 and the third coil 33 (coil group 30).

A shield coil 29 is formed to have a larger diameter than the first coil 31 around the common center axis Z and housed in the chamber 20. The shield coil 29 shields a static magnetic field which leaks outside the electromagnet device 11, which is a part of a static magnetic field generated by the coils (symbol: 31-36) for forming the homogeneous magnetic field, by circulating the circular current in the backward circulation.

Next, a principle for generating a homogeneous magnetic field region will be explained by referring to FIG. 3A.

In the drawing, dark and light areas (dotted area and not-dotted area) which are shown radially from the center of the imaging region U correspond to a magnetic flux density of the static magnetic field formed by a plurality of coils (symbol: 29-36). Namely, a portion surrounded by a surface, which is formed by connecting a coil where the circular current circulates in the forward direction (for example, first coil 31) and the center (hereinafter, referred to as origin) of the imaging region U, and a surface which is formed by connecting a coil adjacent to the coil described above, where the circular current circulates in the backward direction (for example, second coil 32), and the origin is the portion where the angle width of the dotted area (high magnetic flux density area) becomes high as a position approaches the center of the imaging region U from a coil arrangement surface P.

On the other hand, a portion where a magnetic flux density is relatively low is formed adjacent to the portion described above, and a fluctuation of magnetic flux density repeating low and high density alternately in a circulation direction around the origin is formed. Since the fluctuation of the low and high magnetic flux density in the circulation direction around the origin becomes smaller as a position approaches the origin from the coil arrangement surface P, an area where the fluctuation is approximately less than several ppm is considered as a homogeneous magnetic field region and the area becomes the imaging region U.

As described above, since a plurality of coils where circular currents flow in the forward and backward directions alternately in the adjacent coils are concentrically arranged on the coil arrangement surface P, a fluctuation of the low and high magnetic flux density corresponding to a pitch of the coil arrangement is formed in the circulation direction around the origin.

The fluctuation of the magnetic flux density in the circulation direction around the origin described above is caused by the existence of the empty domain S, where the second coil 32 and the coil group 30 are not included, in an angle domain sandwiched between the elevation angle θ2 of the second coil 32 and the elevation angle θ3 of the coil group 30.

It is noted that as a definition of fluctuation pitch of the magnetic flux density in the circulation direction around the origin, an order n corresponding to a number of coils to be arranged on the coil arrangement surface P in the first quadrant of plane coordinates for producing the fluctuation pitch is used.

However, a coil where a current circulates in the backward direction may be omitted in some case. In this case, the order is assumed to be a number of areas where a magnetic field is high in the fluctuation (dotted area in the drawing). Further, based on this idea, if the center axis is in the high intensity area of magnetic filed (correspond to odd order number), the order is counted as 1, summing top and bottom.

In the first embodiment shown in FIG. 3A to FIG. 3D, an example whose order n=6 is shown.

Generally, with respect to a homogeneous magnetic field region to be produced with a high order n, since coils whose circular current directions are different are arranged close to each other, the magnetic field becomes weak in comparison with that of a lower order even if the current is the same. On the other hand, if the homogeneous magnetic field region is produced with a low order n, since a fluctuation pitch of the magnetic flux density in the circulation direction around the origin becomes large, the homogeneous magnetic field region becomes small in comparison with that of high order n even if the current is the same.

(Second Embodiment)

Next, an electromagnet device according to a second embodiment of the present invention will be explained by referring to FIG. 4A and FIG. 4B.

The electromagnet device 11 according to the second embodiment has a structure where the coil group 30 in the first embodiment is replaced with a first magnetization member 41 which is magnetized by a static magnetic field to be induced by the first circular current J1.

Here, returning to FIG. 3A to FIG. 3D, a supplemental explanation will be made in advance before explaining the electromagnet device 11 according to the second embodiment.

FIG. 3B is a schematic diagram virtually showing a case where a circular current J circulates on the coil arrangement surface P, and an upward arrow indicates a circular current J circulating in the forward direction and a downward arrow indicates a circular current J circulating in the backward direction. In addition, a length of the arrow corresponds to a current value.

FIG. 3C shows that a virtual circular current J circulating as shown in FIG. 3B is equivalent to a magnetization member 40, which is arranged as shown in the drawing and magnetized in the center axis direction, and possible to replace the virtual circular current J with the magnetization member 40.

FIG. 3D is an illustration showing a plurality of coils (symbol: 31 to 36) shown in FIG. 3A by replacing with the virtual circular current J circulating on the arrangement surface P, and a part of the plurality of coils (symbol: 31 to 36) by replacing with magnetization members 41, 42.

As shown in FIG. 3D, it is known that the magnetization member 41 is preferably arranged primarily in an area where the magnetic flux density is high corresponding to the order n in the fluctuation of low and high magnetic flux density in the circulation direction on the arrangement surface P.

Returning to FIG. 4A and FIG. 4B, an explanation of a structure shown in the first quadrant (upper side) of plane coordinates in FIG. 3D will be continued as the second embodiment.

Figure 4A:
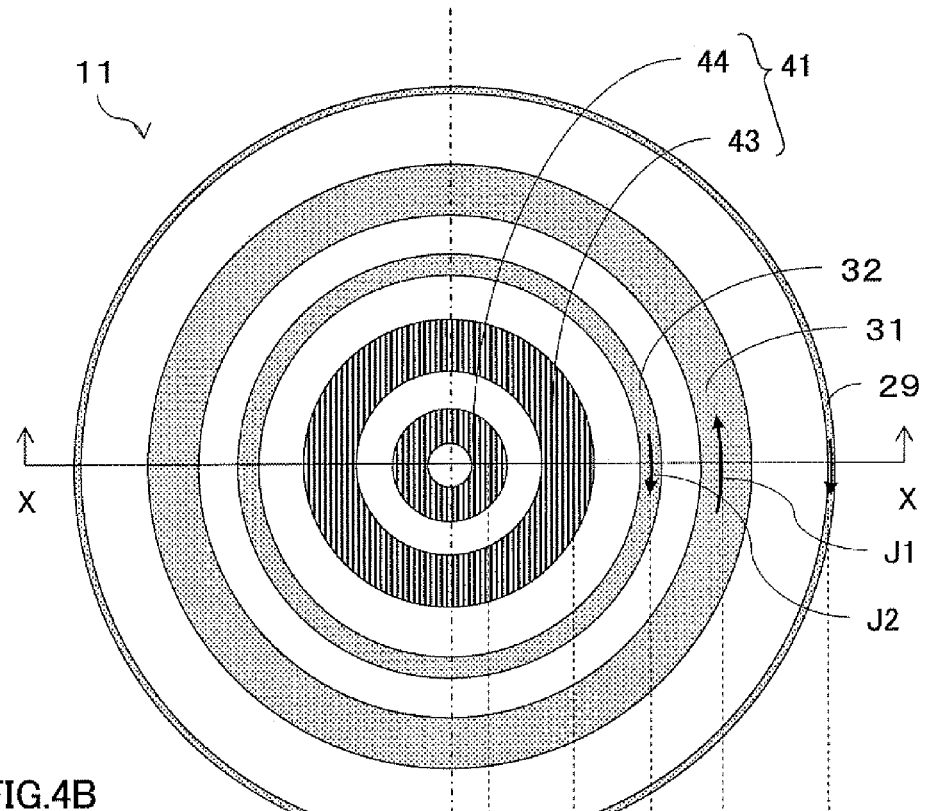
FIG. 4A shows an arrangement of coils on a horizontal plane of an electromagnet device in a second embodiment of electromagnet device according to the present invention.
Figure 4B:
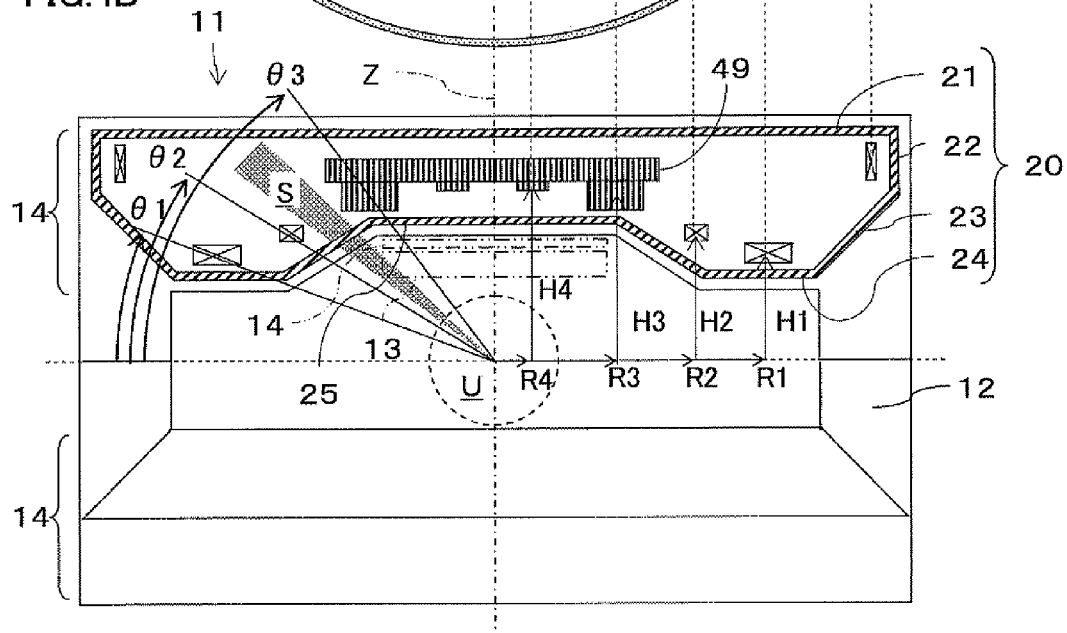
FIG. 4B shows a vertical section of the electromagnet device taken along X-X line of FIG. 4A in the second embodiment of electromagnet device according to the present invention.

Meanwhile, a constituent shown in FIG. 4A, and FIG. 4B and which was explained already is labeled the same symbol with that in FIG. 2A and FIG. 2B, and descriptions of operations and effects of the constituent will be omitted by using the corresponding explanation of the constituent.

The first magnetization member 41 is made of, for example, ferromagnetic material such as pure iron, has a diameter smaller than that of the second coil 32, and is magnetized in a direction identical to a static magnetic field to be induced by the first circular current J1.

The first magnetization member 41 is formed by a first annular body 43 and a second annular body 44, which are connected to a connection plate 49. In addition, the first magnetization member 41 is fixed inside the chamber 20 by a fixing member not shown.

Existence of the connection plate 49 has an effect to enhance magnetic field intensity in the imaging region U due to increase of magnetic flux to be induced by the first coil 31. On the other hand, the first annular body 43 and the second annular body 44 may be fixed independently inside the chamber 20 without using the connection plate 49.

The first annular body 43 and the second annular body 44 have an annular shape whose respective radiuses (R4<R3) become smaller in this order, and are arranged at positions of heights H3, H4 (≥H2), respectively, from the center of the imaging region U in the center axis Z direction. In addition, since the first annular body 43 and the second annular body 44 are magnetized in the center axis Z direction, the first annular body 43 and the second annular body 44 form magnetic fields having directions identical to that of the homogeneous magnetic field and contribute to form the homogeneous magnetic field.

The first coil 31, the second coil 32, and the first magnetization member 41 are arranged so that an elevation angle $\theta m$ (m=1 to 3, see formula (1) described above) of each of the first coil 31, second coil 32, and first magnetization member 41 seen from the center of the imaging region U becomes larger in this order ($\theta 1 < \theta 2 < \theta 3$).

Further, a positional relation between the second coil 32 and the first magnetization member 41 is set so that there exists an empty domain S, where the second coil 32 and the first magnetization member 41 are not included, in an angle domain sandwiched between an elevation angle $\theta 2$ of the second coil 32 and an elevation angle $\theta 3$ of the first magnetization member 41.

When the first coil 31, the second coil 32, and the first magnetization member 41 are arranged as described above, if the arrangements are seen from the center of the imaging region U, all members relating to a formation of the homogeneous magnetic field region in the imaging region U are arranged on a dome-like surface.

(Third Embodiment)

Next, an electromagnet device according to a third embodiment of the present invention will be explained by referring to FIG. 5A and FIG. 5B.

The electromagnet device 11 according to the third embodiment has a structure where the second coil 32 in the second embodiment is replaced with a second magnetization member 42 to be magnetized by a static magnetic field to be induced by the first circular current J1.

Here, returning to FIG. 3D, a supplemental explanation will be made in advance before explaining an electromagnet device 11 according to the third embodiment.

Figure 5A:
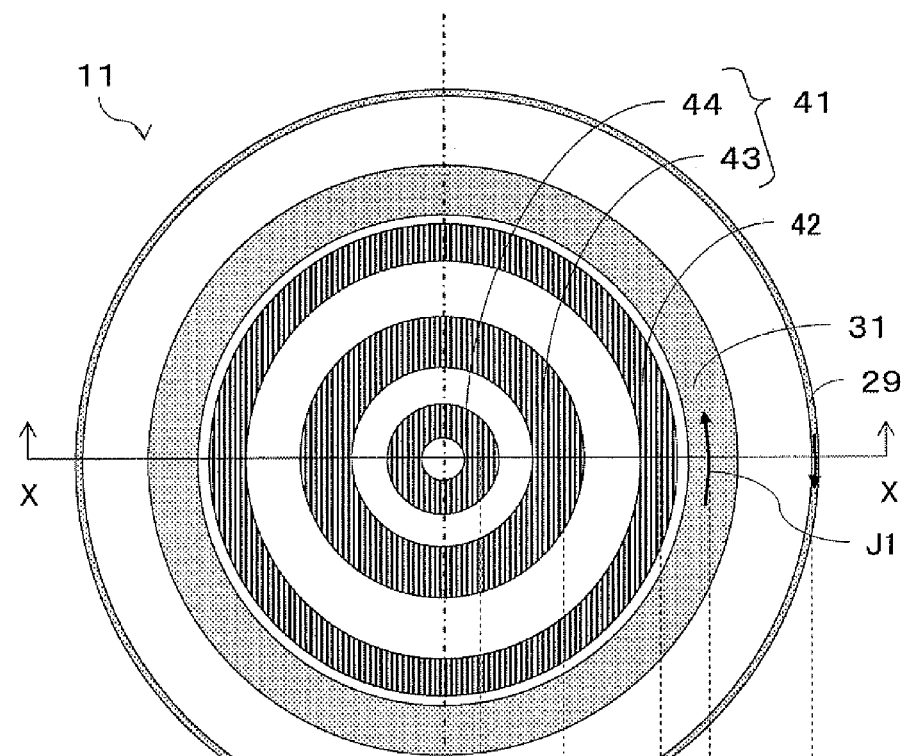
FIG. 5A shows an arrangement of coils on a horizontal plane of an electromagnet device in a third embodiment of electromagnet device according to the present invention.
Figure 5B:
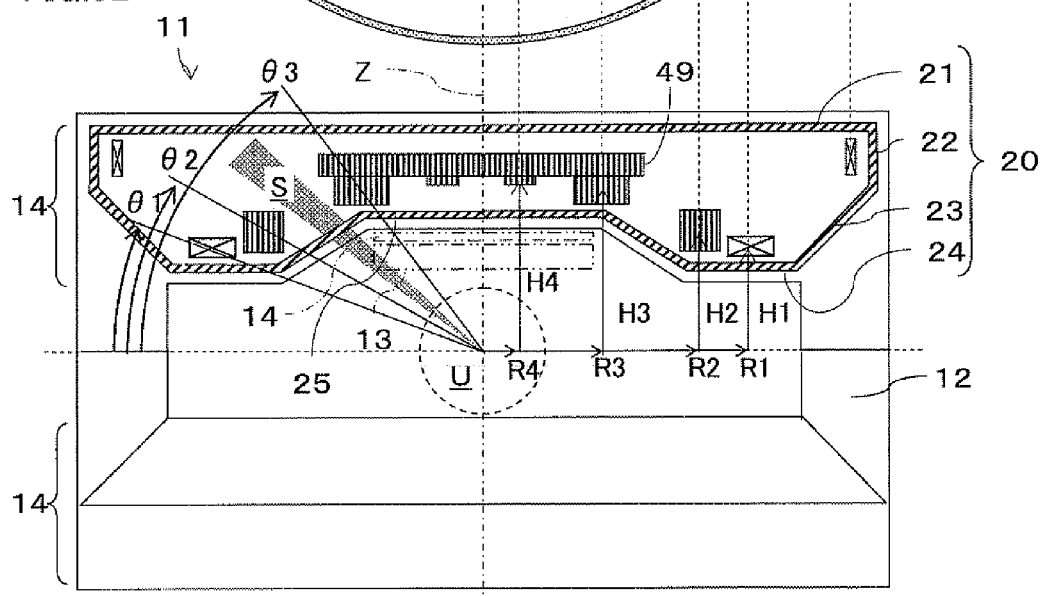
FIG. 5B shows a vertical section of the electromagnet device taken along X-X line of FIG. 5A in the third embodiment of electromagnet device according to the present invention.

Meanwhile, a constituent shown in FIG. 5A and FIG. 5B and which was already explained is labeled the same symbol with that in FIG. 2A and FIG. 2B or FIG. 4A and FIG. 4B, and descriptions of operations and effects of the constituent will be omitted by using the corresponding explanation of the constituent.

The first magnetization member 41 is made of, for example, ferromagnetic material such as pure iron, has a diameter smaller than that of the first coil 31, and is magnetized in a direction identical to a static magnetic field to be induced by the first circular current J1.

The second magnetization member 42 has a diameter smaller than that of the first coil 31 as well as larger than that of the first magnetization member 41, and is magnetized in a direction identical to that of a static magnetic field to be induced by the first circular current J1.

The second magnetization member 42 is fixed inside the chamber 20 by a fixing member not shown. The second magnetization member 42 forms an area where magnetic flux density toward the center of the imaging region U from the arrangement surface P is high together with the first coil 31, and contributes to form the homogeneous magnetic field (see bottom side in FIG. 3D).

The first coil 31, the second magnetization member 42, and the first magnetization member 41 are arranged so that an elevation angle $\theta m$ (m=1 to 3, see formula (1) described above) of each of the first coil 31, second magnetization member 42, and first magnetization member 41 seen from the center of the imaging region U becomes larger in this order ($\theta 1 < \theta 2 < \theta 3$).

Further, a positional relation between the first magnetization member 41 and the second magnetization member 42 is set so that there exists an empty domain S, where the first magnetization member 41 and the second magnetization member 42 are not included, in an angle domain sandwiched between an elevation angle $\theta 2$ of the second magnetization member 42 and an elevation angle $\theta 3$ of the first magnetization member 41.

When the first coil 31, the first magnetization member 41, and the second magnetization member 42 are arranged as described above, if the arrangements are seen from the center of the imaging region U, all members relating to a formation of the homogeneous magnetic field region in the imaging region U are arranged on a dome-like surface.

(Fourth Embodiment)

Next, an electromagnet device according to a fourth embodiment of the present invention will be explained by referring to FIG. 6A and FIG. 6B.

An electromagnet device according to the fourth embodiment shows an example where the order n is variable. FIG. 6A shows the example of n=5 and FIG. 6B shows the example of n=7. In each of first quadrants (upper side) of plane coordinates in FIG. 6A and FIG. 6B, an electromagnet device produced by only a plurality of coils (symbol: 30 to 32) corresponding to the first embodiment is shown, and in each of fourth quadrants (bottom side) of plane coordinates, an electromagnet device produced by the first coil 31 and the magnetization members 41, 42 is shown.

A magnet for practical use has, off course, the same structures in the upper portion and the bottom portion. However, two types of configuration are shown in the single drawing for illustration.

Figure 6A:
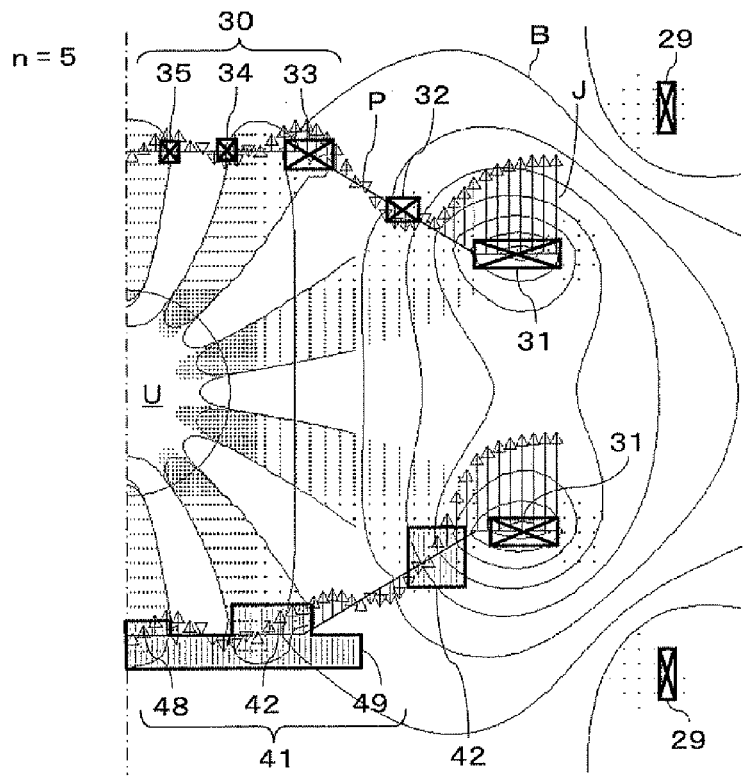
FIG. 6A is an illustration showing a distribution of magnetic flux around an imaging region in a case when the order is five (order n=5) in a fourth embodiment of electromagnet device according to the first embodiment.
Figure 6B:
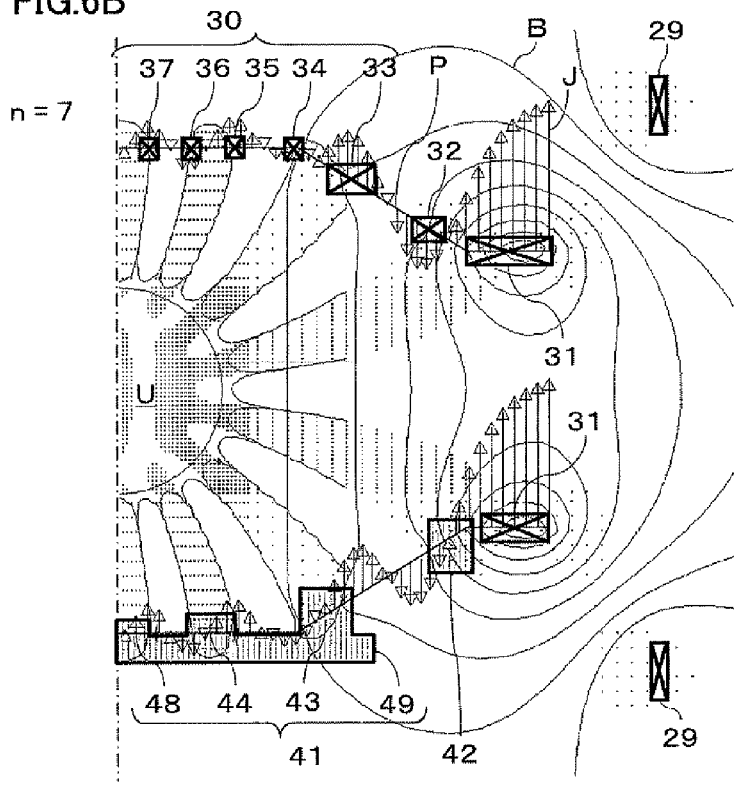
FIG. 6B is an illustration showing a distribution of magnetic flux around an imaging region in a case when the order is seven (order n=7) in the fourth embodiment of electromagnet device according to the first embodiment.

Meanwhile, a constituent shown in FIG. 6A and FIG. 6B, and which was explained already, is labeled the same symbol with that in FIG. 2A and FIG. 2B, FIG. 4A and FIG. 4B, and FIG. 5A and FIG. 5B, and descriptions of operations and effects will be omitted by using the corresponding explanation of the constituent.

In FIG. 6A and FIG. 6B, with respect to an electromagnet device (first quadrant of plane coordinates) produced by only a plurality of coils (symbol: 30 to 32), a number of coils corresponding to the order n are arranged on the arrangement surface P. In addition, with respect to an electromagnet device (fourth quadrant of plane coordinates) produced by the first coil 31 and the magnetization members 41, 42, especially in the electromagnet device which has an odd order number n, a protrusion member 48 which is not annular but protruding is arranged in a portion where the center axis Z of the first magnetization member 41 goes through (as for even order number n, the protrusion member is annular).

In the fourth embodiment, there also exists an empty domain, where the coils (symbol: 30 to 32) and magnetization members 41, 42 are not included, in an angle domain seen from the center of the imaging region U. Therefore, a fluctuation of low and high magnetic flux density which is radially distributed from the center of the imaging region U is formed originating from the empty domain. The fluctuation of low and high magnetic flux density formed as described above becomes smaller as a position approaches the center of the radial distribution, and a homogeneous magnetic field is formed, accordingly.

A case which is available to obtain the operations and effects described above is not limited to the case illustrated in the above explanation where the order n is 5, 6,or 7. Needless to say, even in an order n lower than or higher than the order n described above, a similar homogeneous magnetic field is formed although a size of the homogeneous magnetic field region is different depending on the difference of the order.

A preferable angle range where the empty domain S is set is as follows.

If the electromagnet device is formed with the order of n=5,it is preferable that the angle range is set to a range between −12.5% and +37.5% (from lower limit 35° to upper limit) 55°) with reference to 40° of elevation angle θ seen from the center of the imaging region U.

If the electromagnet device is formed with the order of n=6,it is preferable that the angle range is set to a range between −12.5% and +37.5% (from lower limit 30.625° to upper limit 48.125°) with reference to 35° of the elevation angle θ seen from the center of the imaging region U.

If the electromagnet device is formed with the order of n=7,it is preferable that the angle range is set to a range between −12.5% and +37.5% (from lower limit 26.25° to upper limit 41.25° with reference to 30° of the elevation angle θ seen from the center of the imaging region U.

In addition, with respect to the dome-like arrangement surface P on which a plurality of coils (symbol: 30 to 32) and the magnetization members 41, 42 are arranged, there is a tendency that a uniformity of the magnetic field intensity in the imaging region U is a little improved if the dome-like arrangement surface P is formed as a part of a spherical surface for forming the same size of the imaging region U. However, when the dome-like arrangement surface P approaches a spherical surface, a whole MRI device becomes large. As a result, when the whole device size is limited, a space for inserting an inspection subject becomes narrow.

Therefore, in the electromagnet device 11, a shape of the arrangement surface P should be designed as appropriate without sticking to the empty domain S, which is preferably set as described above, on a trade-off between a size of the space where an inspection subject is inserted and a size of whole device (required reduction level in size and weight).

In addition, the magnetic field adjustment unit 14 (see FIG. 2B) adjusts a magnetic field distribution (low and high distribution of magnetic flux density) on an inner side thereof by adjusting the magnetic field distribution to a magnetic field intensity in the area close to the outermost of the magnetic field adjustment unit 14, where the magnetic flux density is high. Therefore, it is unnecessary to dispose the magnetic field adjustment unit 14 in an area (area including θm; m=1, 2 and at low angle) outside the empty domain S.

Hence, it is preferable that the magnetic field adjustment unit 14 is arranged so that the outermost thereof is included in the empty domain S and disposed in an area ranging from the empty domain S to the inner side (area including 03 and whose radius is small) of the magnetic field adjustment unit 14, from a viewpoint of reduction in weight of the electromagnet device 11 and expansion of effective space where an inspection subject is inserted.

In addition, a surface of a circular truncated cone shown as the circular cone surface 23 in FIG. 2B has an advantage to show the device openly to the inspection subject. The arrangement of the circular cone surface 23 and angle between the circular cone surface 23 and the horizontal plane are determined depending on the inner structure of the electromagnet device 11, especially depending on the arrangements of the first coil 31 and the shield coil 29.

The angle between the circular cone surface 23 and the horizontal plane in the present embodiment is preferably set substantially equal to an elevation angle of the domain S seen from the origin, and specifically, it is preferable that the angle is set to a range approximately from 26° to 40°.

What is claimed is:

1. An electromagnet device, of a vertical magnetic field type, which is provided with a pair of static magnetic field generation units for generating a static magnetic field to be induced by a circular current circulating around a center axis and which forms a homogeneous magnetic field region in a space where the pair of the static magnetic field generation units face each other,
wherein the static magnetic field generation units comprise at least:
a first coil where a first circular current circulates around the center axis in a forward direction;
a second coil where a second circular current whose radius is smaller than a radius of the first circular current circulates around the center axis in a backward direction; and
a coil group where a plurality of circular currents whose radiuses are smaller than the radius of the second circular current circulate around the center axis in the forward direction and the backward direction alternately in adjacent coils,
wherein the first coil, the second coil, and the coil group are arranged so that an elevation angle of each of the first coil, the second coil, and the coil group seen from a center of the homogeneous magnetic field region becomes larger in this order,
wherein there exists an empty domain where the second coil and the coil group are not included in an angle domain sandwiched between the elevation angles of the second coil and the coil group, and wherein the empty domain is set in a range having the elevation angle between 26.25° and 55°.

2. An electromagnet device, of a vertical magnetic field type, which is provided with a pair of static magnetic field generation units for generating a static magnetic field to be induced by a circular current circulating around a center axis and which forms a homogeneous magnetic field region in a space where the pair of the static magnetic field generation units face each other, wherein the static magnetic field generation units comprise at least:

a first coil where a first circular current circulates around the center axis in a forward direction;

a second coil where a second circular current whose radius is smaller than a radius of the first circular current circulates around the center axis in a backward direction; and a first magnetization member whose radius is smaller than the radius of the second coil and to be magnetized by a static magnetic field to be induced by the first circular current, wherein the first coil, the second coil, and the first magnetization member are arranged so that an elevation angle of each of the first coil, the second coil, and the first magnetization member seen from a center of the homogeneous magnetic field region becomes larger in this order, wherein there exists an empty domain where the second coil and the first magnetization member are not included in an angle domain sandwiched between the elevation angles of the second coil and the first magnetization member, and wherein the empty domain is set in a range having the elevation angle between 26.25° and 55°.

3. An electromagnet device, of a vertical magnetic field type, which is provided with a pair of static magnetic field generation units for generating a static magnetic field to be induced by a circular current circulating around a center axis and which forms a homogeneous magnetic field region in a space where the pair of the static magnetic field generation units face each other, wherein the static magnetic field generation units comprise at least:

a first coil where a first circular current circulates around the center axis in a forward direction;

a first magnetization member whose radius is smaller than a radius of the first coil and to be magnetized by a static magnetic field to be induced by the first circular current; and a second magnetization member whose radius is smaller than the radius of the first coil and larger than the radius of the first magnetization member and to be magnetized by the static magnetic field to be induced by the first circular current, wherein the first coil, the second magnetization member, and the first magnetization member are arranged so that an elevation angle of each of the first coil, the second magnetization member, and the first magnetization member seen from a center of the homogeneous magnetic field region becomes larger in this order, wherein there exists an empty domain where the first magnetization member and the second magnetization member are not included in an angle domain sandwiched between the elevation angles of the first magnetization member and the second magnetization member, and wherein the empty domain is set in a range having the elevation angle between 26.25° and 55°.

4. The electromagnet device according to claim 1, further comprising a chamber for housing components included in the static magnetic field generation unit, wherein a depressed surface substantially perpendicular to the center axis is disposed on an inner end surface of the chamber facing the homogeneous magnetic field region.

5. The electromagnet device according to claim 2, further comprising a chamber for housing components included in the static magnetic field generation unit, wherein a depressed surface substantially perpendicular to the center axis is disposed on an inner end surface of the chamber facing the homogeneous magnetic field region.

6. The electromagnet device according to claim 3, further comprising a chamber for housing components included in the static magnetic field generation unit, wherein a depressed surface substantially perpendicular to the center axis is disposed on an inner end surface of the chamber facing the homogeneous magnetic field region.

7. The electromagnet device according to claim 4, wherein a shield coil whose radius is larger than the radius of the first coil and where a circular current circulates in the backward direction is further housed in the chamber for shielding the static magnetic field which leaks outside, wherein a circular cone surface is formed in a portion ranging from the inner end surface to a cylinder side surface adjacent to the shield coil.

8. The electromagnet device according to claim 5, wherein a shield coil whose radius is larger than the radius of the first coil and where a circular current circulates in the backward direction is further housed in the chamber for shielding the static magnetic field which leaks outside, wherein a circular cone surface is formed in a portion ranging from the inner end surface to a cylinder side surface adjacent to the shield coil.

9. The electromagnet device according to claim 6, wherein a shield coil whose radius is larger than the radius of the first coil and where a circular current circulates in the backward direction is further housed in the chamber for shielding the static magnetic field which leaks outside, wherein a circular cone surface is formed in a portion ranging from the inner end surface to a cylinder side surface adjacent to the shield coil.

10. The electromagnet device according to claim 1, wherein a magnetic field adjustment unit for adjusting a magnetic field distribution in the homogeneous magnetic field region by appropriately distributing a magnetic material on a surface perpendicular to the center axis is arranged so that an outermost portion of the magnetic field adjustment unit is included in the homogeneous magnetic field region.

11. The electromagnet device according to claim 2, wherein a magnetic field adjustment unit for adjusting a magnetic field distribution in the homogeneous magnetic field region by appropriately distributing a magnetic material on a surface perpendicular to the center axis is arranged so that an outermost portion of the magnetic field adjustment unit is included in the homogeneous magnetic field region.

12. The electromagnet device according to claim 3, wherein a magnetic field adjustment unit for adjusting a magnetic field distribution in the homogeneous magnetic field region by appropriately distributing a magnetic material on a surface perpendicular to the center axis is arranged so that an outermost portion of the magnetic field adjustment unit is included in the homogeneous magnetic field region.

13. A magnetic resonance imaging device for imaging an image of an inspection subject by utilizing a magnetic resonance phenomenon in a homogeneous magnetic field region as an imaging region, the magnetic resonance imaging device comprising:
- an electromagnet device according to claim 1; and
- a gradient magnetic field generation unit for generating a gradient magnetic field in the homogeneous magnetic field region.

14. A magnetic resonance imaging device for imaging an image of an inspection subject by utilizing a magnetic resonance phenomenon in a homogeneous magnetic field region as an imaging region, the magnetic resonance imaging device comprising:
- an electromagnet device according to claim 2; and
- a gradient magnetic field generation unit for generating a gradient magnetic field in the homogeneous magnetic field region.

15. A magnetic resonance imaging device for imaging an image of an inspection subject by utilizing a magnetic resonance phenomenon in a homogeneous magnetic field region as an imaging region, the magnetic resonance imaging device comprising:
- an electromagnet device according to claim 3; and a gradient magnetic field generation unit for generating a gradient magnetic field in the homogeneous magnetic field region.

16. The electromagnet device, of a vertical magnetic field type, according to claim 1,
- wherein a magnetic material is arbitrarily distributed on a plane perpendicular to the center axis, and the magnetic field adjustment unit which adjusts a magnetic field of the homogeneous magnetic field region, is arranged so that the outermost thereof is included in the empty domain.

17. The electromagnet device, of a vertical magnetic field type, according to claim 2,
- wherein a magnetic material is arbitrarily distributed on a plane perpendicular to the center axis, and the magnetic field adjustment unit which adjusts a magnetic field of the homogeneous magnetic field region, is arranged so that the outermost thereof is included in the empty domain.

18. The electromagnet device, of a vertical magnetic field type, according to claim 3,
- wherein a magnetic material is arbitrarily distributed on a plane perpendicular to the center axis, and the magnetic field adjustment unit which adjusts a magnetic field of the homogeneous magnetic field region, is arranged so that the outermost thereof is included in the empty domain.

* * * * *